United States Patent
Lee

(10) Patent No.: US 12,207,555 B2
(45) Date of Patent: Jan. 21, 2025

(54) THERMOELECTRIC ELEMENT

(71) Applicant: LG INNOTEK CO., LTD., Seoul (KR)

(72) Inventor: Seung Hwan Lee, Seoul (KR)

(73) Assignee: LG INNOTEK CO., LTD., Seoul (KR)

(*) Notice: Subject to any disclaimer, the term of this patent is extended or adjusted under 35 U.S.C. 154(b) by 229 days.

(21) Appl. No.: 17/907,364

(22) PCT Filed: Mar. 18, 2021

(86) PCT No.: PCT/KR2021/003339
§ 371 (c)(1),
(2) Date: Sep. 26, 2022

(87) PCT Pub. No.: WO2021/194158
PCT Pub. Date: Sep. 30, 2021

(65) Prior Publication Data
US 2023/0122056 A1    Apr. 20, 2023

(30) Foreign Application Priority Data
Mar. 25, 2020  (KR) .................. 10-2020-0036424

(51) Int. Cl.
*H10N 10/851*  (2023.01)
*H10N 10/13*   (2023.01)

(52) U.S. Cl.
CPC ......... *H10N 10/8556* (2023.02); *H10N 10/13* (2023.02)

(58) Field of Classification Search
CPC .... H10N 10/8556; H10N 10/13; H10N 10/17; H10N 10/852; H10N 10/81; H10N 10/855
See application file for complete search history.

(56) References Cited

U.S. PATENT DOCUMENTS

2018/0279486 A1    9/2018    Matsumoto

FOREIGN PATENT DOCUMENTS

| JP | 2009-182310 A | 8/2009 |
| JP | 2017-210910 A | 11/2017 |

(Continued)

OTHER PUBLICATIONS

International Search Report dated Jun. 25, 2021 in International Application No. PCT/KR2021/003339.

*Primary Examiner* — Angelo Trivisonno
(74) *Attorney, Agent, or Firm* — Saliwanchik, Lloyd & Eisenschenk

(57) ABSTRACT

A thermoelectric element according to one example of the present invention comprises: a first substrate; a first insulating layer disposed on the first substrate; a first bonding layer disposed on the first insulating layer; a second insulating layer disposed on the first bonding layer; a first electrode disposed on the second insulating layer; a P-type thermoelectric leg and N-type thermoelectric leg, disposed on the first electrode; a second electrode disposed on the P-type thermoelectric leg and N-type thermoelectric leg; a third insulating layer disposed on the second electrode; and a second substrate disposed on the third insulating layer, wherein the first insulating layer is composed of a composite comprising silicon and aluminum, the second insulating layer is a resin layer composed of a resin composition comprising an inorganic filler and at least one of an epoxy resin and a silicone resin, and the first bonding layer comprises a silane coupling agent.

20 Claims, 10 Drawing Sheets

(56) References Cited

FOREIGN PATENT DOCUMENTS

| | | |
|---|---|---|
| KR | 10-2019-0013046 A | 2/2019 |
| KR | 10-2019-0093516 A | 8/2019 |
| WO | WO-2012131007 A2 * 10/2012 | ............. H01L 23/38 |

* cited by examiner

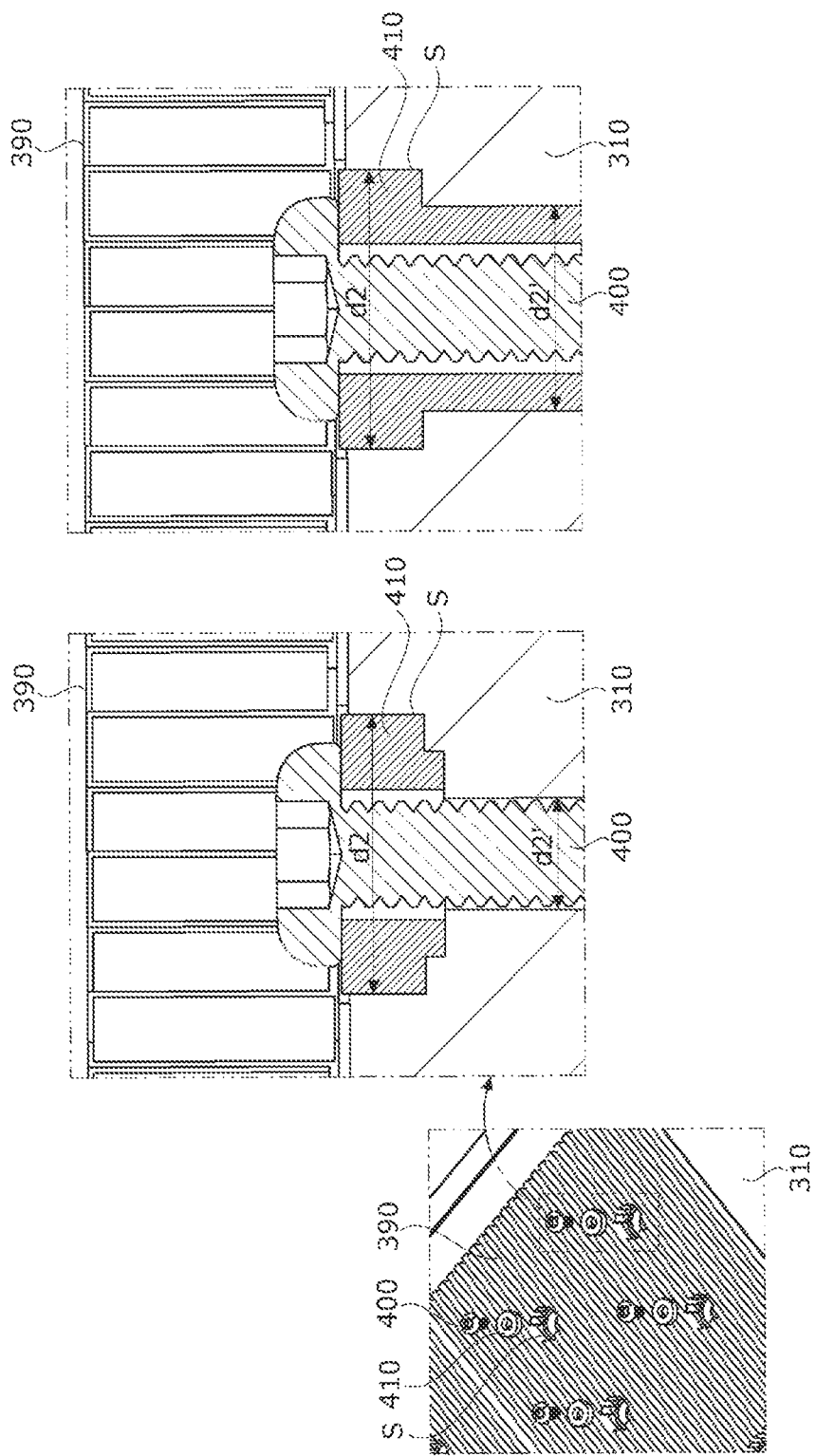

THERMOELECTRIC ELEMENT

CROSS-REFERENCE TO RELATED APPLICATIONS

This application is the U.S. national stage application of International Patent Application No. PCT/KR2021/003339, filed Mar. 18, 2021, which claims the benefit under 35 U.S.C. § 119 of Korean Application No. 10-2020-0036424, filed Mar. 25, 2020, the disclosures of each of which are incorporated herein by reference in their entirety.

TECHNICAL FIELD

The present invention relates to a thermoelectric element, and more specifically, to an insulating layer of a thermoelectric element.

BACKGROUND ART

A thermoelectric effect is a direct energy conversion phenomenon between heat and electricity that occurs due to the movement of electrons and holes in a material.

A thermoelectric element is generally referred to as an element using a thermoelectric effect and has a structure in which P-type thermoelectric materials and N-type thermoelectric materials are disposed between and bonded to metal electrodes to form PN junction pairs. Thermoelectric elements may be divided into elements using a change in electrical resistance depending on a change in temperature, elements using the Seebeck effect in which an electromotive force is generated due to a difference in temperature, elements using the Peltier effect in which heat absorption or heating occurs due to a current, and the like. Thermoelectric elements have been variously applied to home appliances, electronic components, communication components, and the like. As an example, thermoelectric elements may be applied to cooling apparatuses, heating apparatuses, power generation apparatuses, and the like. Therefore, the demand for the thermoelectric performance of the thermoelectric element is gradually increasing.

A thermoelectric element includes substrates, electrodes, and thermoelectric legs, wherein the plurality of thermoelectric legs are disposed between an upper substrate and a lower substrate in an array form, a plurality of upper electrodes are disposed between the plurality of thermoelectric legs and the upper substrate, and a plurality of lower electrodes are disposed between the plurality of thermoelectric legs and the lower substrate. In this case, one of the upper substrate and the lower substrate may become a low-temperature part, and the remaining one may become a high-temperature part.

Meanwhile, in order to improve the heat conduction performance of a thermoelectric element, efforts to use a metal substrate have been increasing.

Generally, a thermoelectric element may be manufactured in a process of sequentially stacking electrodes and thermoelectric legs on a prepared metal substrate. When a metal substrate is used, an advantageous effect in terms of heat conduction can be obtained, but there is a problem that reliability is degraded when the thermoelectric element is used for a long period of time due to a low withstand voltage. In order to increase the withstand voltage of the thermoelectric element, there are efforts to change the composition or structure of an insulating layer disposed between the metal substrate and the electrodes, but there may be a problem that the heat conduction performance of the thermoelectric element is degraded according to the composition or the structure of the insulating layer.

DISCLOSURE

Technical Problem

The present invention is directed to providing a thermoelectric element with both improved heat conduction performance and improved withstand voltage performance.

Technical Solution

One aspect of the present invention provides a thermoelectric element including a first substrate, a first insulating layer disposed on the first substrate, a first bonding layer disposed on the first insulating layer, a second insulating layer disposed on the first bonding layer, first electrodes disposed on the second insulating layer, a P-type thermoelectric leg and an N-type thermoelectric leg disposed on the first electrodes, second electrodes disposed on the P-type thermoelectric leg and the N-type thermoelectric leg, a third insulating layer disposed on the second electrodes, and a second substrate disposed on the third insulating layer, wherein the first insulating layer is formed of a composite containing silicon and aluminum, the second insulating layer is formed of a resin layer including a resin composition including at least one of an epoxy resin and a silicon resin and an inorganic filler, and the first bonding layer includes a silane coupling agent.

The silane coupling agent may include at least one functional group among an epoxy group, an amino group, and a vinyl group.

The first insulating layer and the first bonding layer may be chemically bonded to each other, and the first bonding layer and the second insulating layer may be chemically bonded to each other.

A thickness of the first bonding layer may be in the range of 1 to 5 μm.

A thickness of the second insulating layer may be greater than a thickness of the first insulating layer, and the thickness of the first insulating layer may be greater than the thickness of the first bonding layer.

The third insulating layer may be formed of a resin layer including a resin composition including at least one of an epoxy resin and a silicon resin and an inorganic filler.

The thermoelectric element may further include a fourth insulating layer disposed between the third insulating layer and the second substrate and formed of a composite containing silicon and aluminum and a second bonding layer disposed between the third insulating layer and the fourth insulating layer and including a silane coupling agent.

The thermoelectric element may further include an aluminum oxide layer disposed between the third insulating layer and the second substrate, wherein the second substrate may be an aluminum substrate.

The aluminum oxide layer may be disposed on an entire surface of the aluminum substrate.

The thermoelectric element may further include a heat sink disposed on at least one of the first substrate and the second substrate.

Another aspect of the present invention provides a power generation apparatus including a first fluid flow part in which a flow path is formed so that a first fluid flows, a thermoelectric element coupled to the first fluid flow part, and a second fluid flow part which is coupled to the thermoelectric element and in which a flow path is formed so that a second fluid having a higher temperature than the first fluid flows, wherein the thermoelectric element includes a first substrate coupled to the first fluid flow part, a first insulating layer disposed on the first substrate, a first bonding layer disposed on the first insulating layer, a second insulating layer disposed on the first bonding layer, first electrodes disposed on the second insulating layer, a P-type thermoelectric leg and an N-type thermoelectric leg disposed on the first electrodes, second electrodes disposed on the P-type thermoelectric leg and the N-type thermoelectric leg, a third insulating layer disposed on the second electrodes, and a second substrate disposed on the third insulating layer and coupled to the second fluid flow part, the first insulating layer is formed of a composite containing silicon and aluminum, the second insulating layer is formed of a resin layer including a resin composition including at least one of an epoxy resin and a silicon resin and an inorganic filler, and the first bonding layer includes a silane coupling agent.

Advantageous Effects

According to embodiments, a thermoelectric element with high performance and reliability can be obtained. Particularly, according to the embodiments, the thermoelectric element with not only improved heat conduction performance but also improved withstand voltage performance can be obtained. Accordingly, when the thermoelectric element according to the embodiment of the present invention is applied to a power generation apparatus, high power generation performance can be achieved.

The thermoelectric element according to the embodiment of the present invention can be applied not only an application implemented in a small type but also an application implemented in a large type such as vehicles, ships, steel mills, and incinerators.

DESCRIPTION OF DRAWINGS

FIGS. 10A and 10B are a set of views illustrating a coupling structure of a thermoelectric element according to one embodiment of the present invention.

MODES OF THE INVENTION

Hereinafter, exemplary embodiments of the present invention will be described in detail with reference to the accompanying drawings.

However, the technical spirit of the present invention is not limited to some embodiments which will be described and may be realized using various other embodiments, and at least one component of the embodiments may be selectively coupled, substituted, and used within the range of the technical spirit of the present invention.

In addition, unless clearly and specifically defined otherwise by context, all terms (including technical and scientific terms) used herein can be interpreted as having meanings customarily understood by those skilled in the art, and meanings of generally used terms, such as those defined in commonly used dictionaries, will be interpreted by considering contextual meanings of the related technology.

In addition, the terms used in the embodiments of the present invention are considered in a descriptive sense and not for limiting the present invention.

In the present specification, unless specifically indicated otherwise by the context, singular forms may include the plural forms thereof, and in a case in which "at least one (or one or more) among A, B, and C" is described, this may include at least one combination among all possible combinations of A, B, and C.

In addition, in descriptions of components of the present invention, terms such as "first," "second," "A," "B," "(a)," and "(b)" can be used.

The terms are only to distinguish one element from another element, and an essence, order, and the like of the element are not limited by the terms.

In addition, when an element is referred to as being "connected" or "coupled" to another element, such a description may include not only a case in which the element is directly connected or coupled to another element but also a case in which the element is connected or coupled to another element with still another element disposed therebetween.

In addition, in a case in which any one element is described as being formed or disposed "on" or "under" another element, such a description includes not only a case in which the two elements are formed or disposed in direct contact with each other but also a case in which one or more other elements are formed or disposed between the two elements. In addition, when one element is described as being disposed "on or under" another element, such a description may include a case in which the one element is disposed at an upper side or lower side with respect to another element.

Figure 1:
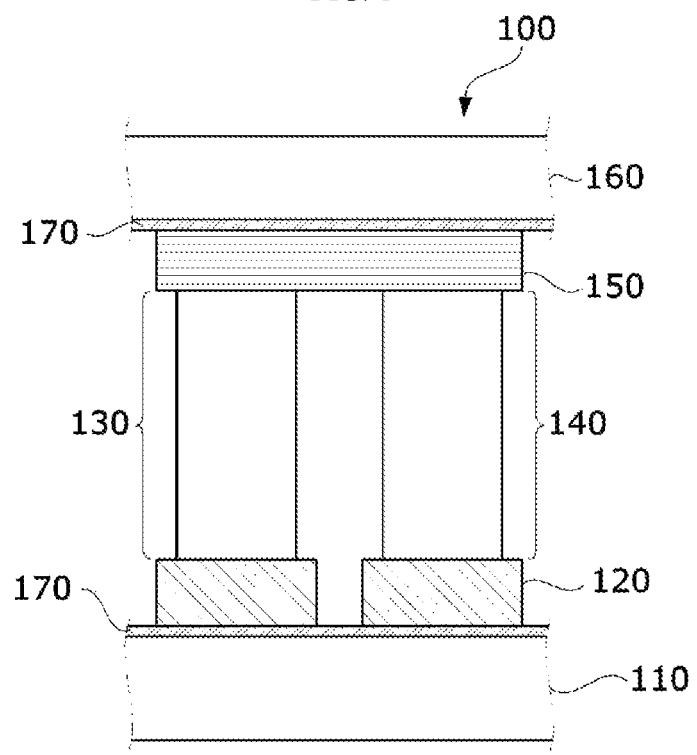
FIG. 1 is a cross-sectional view illustrating a thermoelectric element.
Figure 2:
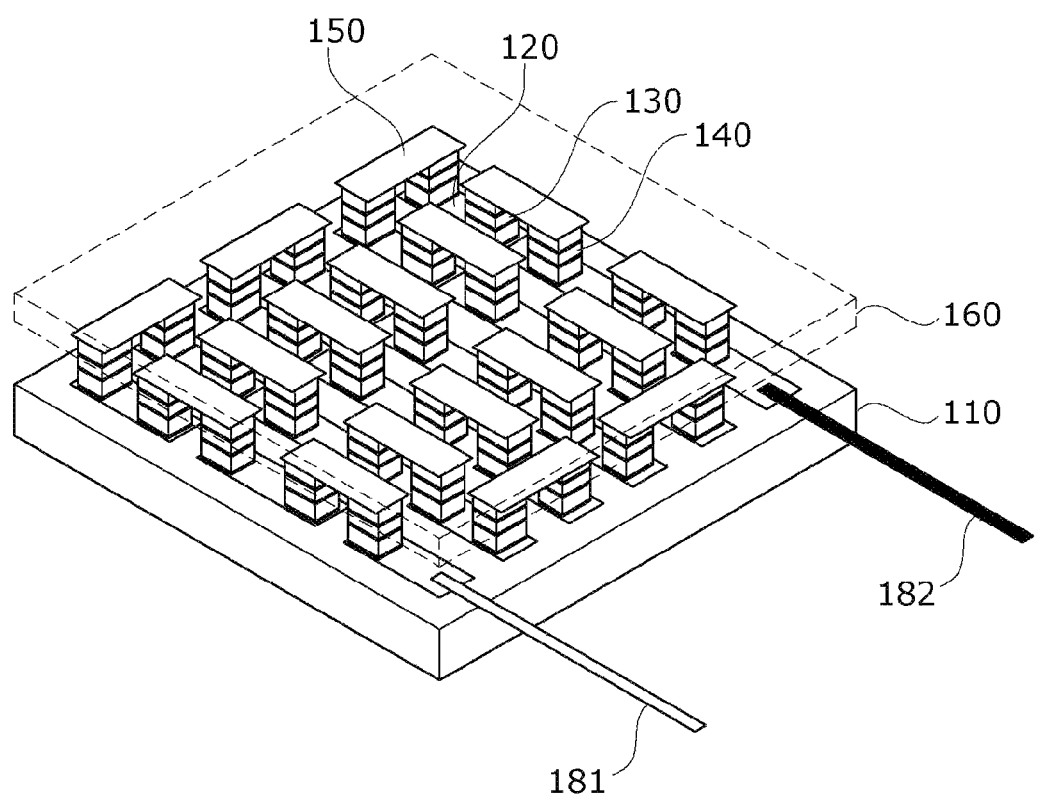
FIG. 2 is a perspective view illustrating the thermoelectric element.
Figure 3:
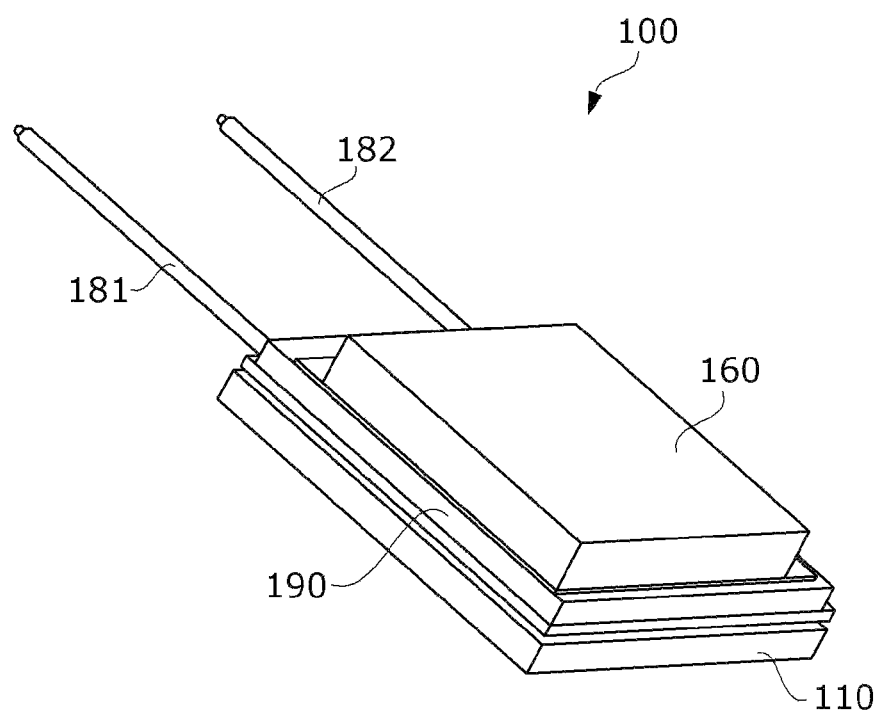
FIG. 3 is a perspective view illustrating the thermoelectric element including a sealing member.
Figure 4:
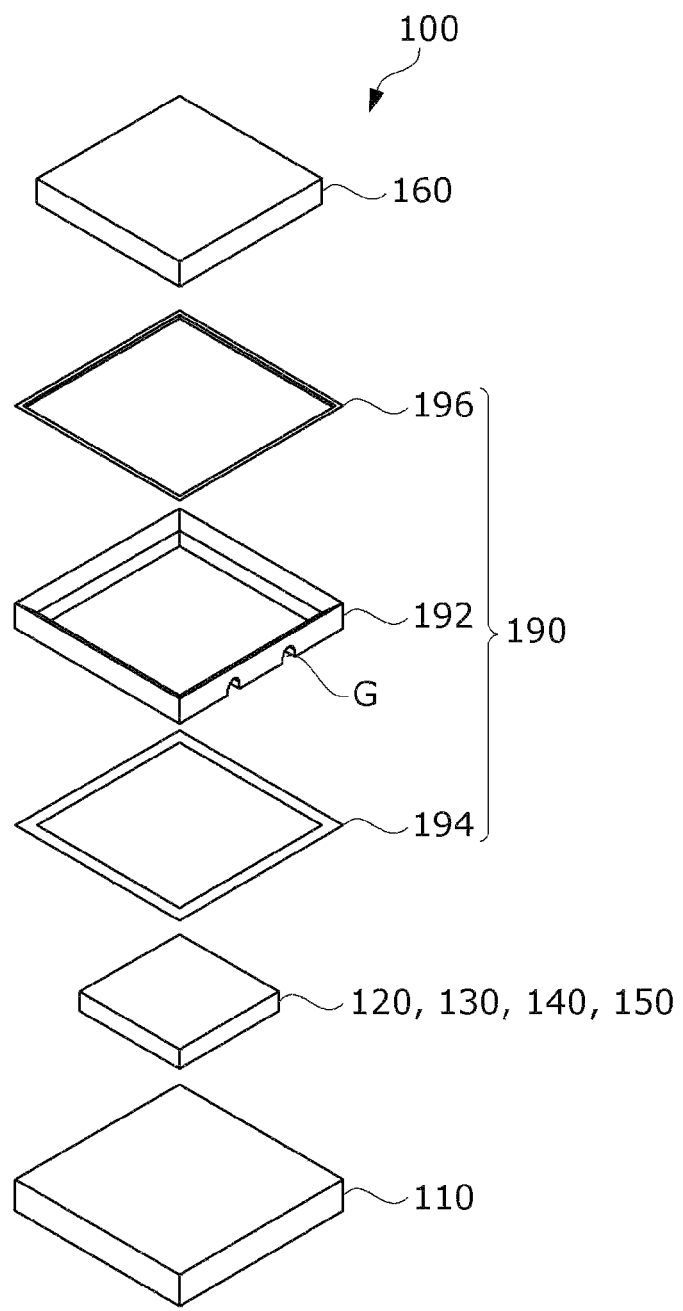
FIG. 4 is an exploded perspective view illustrating the thermoelectric element including the sealing member.

FIG. 1 is a cross-sectional view illustrating a thermoelectric element, and FIG. 2 is a perspective view illustrating the thermoelectric element. FIG. 3 is a perspective view illustrating the thermoelectric element including a sealing member, and FIG. 4 is an exploded perspective view illustrating the thermoelectric element including the sealing member.

Referring to FIGS. 1 and 2, a thermoelectric element 100 includes a lower substrate 110, lower electrodes 120, P-type thermoelectric legs 130, N-type thermoelectric legs 140, upper electrodes 150, and an upper substrate 160.

The lower electrodes 120 are disposed between the lower substrate 110 and lower surfaces of the P-type thermoelectric legs 130 and the N-type thermoelectric legs 140, and the upper electrodes 150 are disposed between the upper substrate 160 and upper surfaces of the P-type thermoelectric legs 130 and the N-type thermoelectric legs 140. Accordingly, the plurality of P-type thermoelectric legs 130 and the plurality of N-type thermoelectric legs 140 are electrically connected through the lower electrodes 120 and the upper electrodes 150. A pair of the P-type thermoelectric leg 130 and the N-type thermoelectric leg 140 that are disposed between the lower electrodes 120 and the upper electrode 150 and electrically connected to each other may form a unit cell.

As an example, when a voltage is applied to the lower electrodes 120 and the upper electrodes 150 through lead wires 181 and 182, due to the Peltier effect, the substrate through which a current flows from the P-type thermoelectric leg 130 to the N-type thermoelectric leg 140 may absorb heat to serve as a cooling portion, and the substrate through which a current flows from the N-type thermoelectric leg 140 to the P-type thermoelectric leg 130 may be heated to serve as a heating portion. Alternatively, when different temperatures are applied to the lower electrode 120 and the upper electrode 150, due to the Seebeck effect, electric charges may move through the P-type thermoelectric leg 130 and the N-type thermoelectric leg 140 so that electricity may also be generated.

In FIGS. 1 to 4, it is illustrated that the lead wires 181 and 182 are disposed on the lower substrate 110, but the present invention is not limited thereto. The lead wires 181 and 182 may be disposed on the upper substrate 160, one of the lead wires 181 and 182 may be disposed on the lower substrate 110, and the other may also be disposed on the upper substrate 160.

In this case, each of the P-type thermoelectric leg 130 and the N-type thermoelectric leg 140 may be a bismuth-telluride (Bi—Te)-based thermoelectric leg mainly including Bi and Te. The P-type thermoelectric leg 130 may be a Bi—Te-based thermoelectric leg including at least one among antimony (Sb), nickel (Ni), aluminum (Al), copper (Cu), silver (Ag), lead (Pb), boron (B), gallium (Ga), Te, Bi, and indium (In). As an example, the P-type thermoelectric leg 130 may include Bi—Sb—Te at 99 to 99.999 wt % as a main material and at least one material among Ni, Al, Cu, Ag, Pb, B, Ga, and In at 0.001 to 1 wt % based on a total weight of 100 wt %. The N-type thermoelectric leg 140 may be the Bi—Te-based thermoelectric leg including at least one among Se, Ni, Al, Cu, Ag, Pb, B, Ga, Te, Bi, and In. As an example, the N-type thermoelectric leg 140 may include Bi—Se—Te at 99 to 99.999 wt % as a main material and at least one material among Ni, Al, Cu, Ag, Pb, B, Ga, and In at 0.001 to 1 wt % based on a total weight of 100 wt %. Accordingly, in the present specification, the thermoelectric leg may also be referred to as a semiconductor structure, a semiconductor element, a semiconductor material layer, a conductive semiconductor structure, a thermoelectric structure, a thermoelectric material layer, or the like.

Each of the P-type thermoelectric leg 130 and the N-type thermoelectric leg 140 may be formed in a bulk type or stack type. Generally, the bulk type P-type thermoelectric leg 130 or the bulk type N-type thermoelectric leg 140 may be formed through a process in which a thermoelectric material is thermally treated to manufacture an ingot, the ingot is ground and strained to obtain a powder for a thermoelectric leg, the powder is sintered, and the sintered powder is cut. In this case, each of the P-type thermoelectric leg 130 and the N-type thermoelectric leg 140 may be a polycrystalline thermoelectric leg. When the powder for the thermoelectric leg is sintered in order to manufacture the polycrystalline thermoelectric leg, the powder may be compressed at 100 MPa to 200 MPa. As an example, when the P-type thermoelectric leg 130 is sintered, the powder for the thermoelectric leg may be sintered at 100 to 150 MPa, preferably at 110 to 140 MPa, and more preferably at 120 to 130 MPa. In addition, when the N-type thermoelectric leg 130 is sintered, the powder for the thermoelectric leg may be sintered at 150 to 200 MPa, preferably at 160 to 195 MPa, and more preferably at 170 to 190 MPa. As described above, when each of the P-type thermoelectric leg 130 and the N-type thermoelectric leg 140 is the polycrystalline thermoelectric leg, the strength of the P-type thermoelectric leg 130 and the N-type thermoelectric leg 140 may increase. The stacked P-type thermoelectric leg 130 or the stacked N-type thermoelectric leg 140 may be formed in a process in which a paste containing a thermoelectric material is applied on base members each having a sheet shape to form unit members, and the unit members are stacked and cut.

In this case, the P-type thermoelectric leg 130 and the N-type thermoelectric leg 140 provided in a pair may have the same shape and volume or may have different shapes and volumes. As an example, since electrical conduction properties of the P-type thermoelectric leg 130 and the N-type thermoelectric leg 140 are different, a height or cross-sectional area of the N-type thermoelectric leg 140 may be different from that of the P-type thermoelectric leg 130.

In this case, the P-type thermoelectric leg 130 or N-type thermoelectric leg 140 may have a cylindrical shape, a polygonal column shape, an elliptical column shape, or the like.

Alternatively, the P-type thermoelectric leg 130 or the N-type thermoelectric leg 140 may also have a stacked structure. As an example, the P-type thermoelectric leg or the N-type thermoelectric leg may be formed using a method in which a plurality of structures in which a semiconductor material is applied on base members each having a sheet shape are stacked and cut. Accordingly, material loss can be inhibited, and an electrical conduction property can be improved. The structures may further include conductive layers having open patterns, and thus, an adhesive force between the structures can increase, thermal conductivity can decrease, and electrical conductivity can increase.

Alternatively, the P-type thermoelectric leg 130 or the N-type thermoelectric leg 140 may have different cross-sectional areas formed in one thermoelectric leg. As an example, in one thermoelectric leg, cross-sectional areas of both end portions disposed toward the electrodes are greater than a cross-sectional area between both end portions. Accordingly, since a temperature difference between both end portions may be large, a thermoelectric efficiency can be improved.

The performance of a thermoelectric element according to one embodiment of the present invention may be expressed as a thermoelectric performance figure of merit (ZT). The thermoelectric performance figure of merit (ZT) may be expressed by Equation 1.

$$ZT=\alpha^2 \cdot \sigma \cdot T/k \qquad \text{[Equation 1]}$$

Here, α denotes the Seebeck coefficient [V/K], σ denotes electrical conductivity [S/m], and $\alpha^2 \cdot \sigma$ denotes a power factor [W/mK$^2$]. In addition, T denotes temperature, and k denotes thermal conductivity [W/mK]. k may be expressed as a·cp·ρ, wherein a denotes thermal diffusivity [cm$^2$/S], cp denotes specific heat [J/gK], and ρ denotes density [g/cm$^3$].

In order to obtain the thermoelectric performance figure of merit (ZT) of a thermoelectric element, a Z value (V/K) is measured using a Z meter, and thus the thermoelectric performance figure of merit (ZT) may be calculated using the measured Z value.

In this case, each of the lower electrodes 120 disposed between the lower substrate 110 and the P-type thermoelectric legs 130 and N-type thermoelectric legs 140 and the upper electrodes 150 disposed between the upper substrate 160 and the P-type thermoelectric legs 130 and N-type thermoelectric legs 140 may include at least one among Cu, Ag, Al, and Ni and may have a thickness of 0.01 mm to 0.3 mm. When the thickness of the lower electrode 120 or the upper electrode 150 is less than 0.01 mm, an electrode function is degraded, and thus the electrical conductivity performance can be degraded, and when the thickness thereof is greater than 0.3 mm, resistance increases, and thus conduction efficiency can be lowered.

In addition, the lower substrate 110 and the upper substrate 160, which are opposite to each other, may be metal substrates, and a thickness of each of the lower substrate 110 and the upper substrate 160 may be in the range of 0.1 mm to 1.5 mm. When the thickness of the metal substrate is less than 0.1 mm or greater than 1.5 mm, since a heat radiation property or thermal conductivity may become excessively high, reliability of the thermoelectric element can be degraded. In addition, when the lower substrate 110 and the upper substrate 160 are the metal substrates, insulating layers 170 may be further formed between the lower substrate 110 and the lower electrodes 120 and between the upper substrate 160 and the upper electrodes 150. Each of the insulating layers 170 may include a material having a thermal conductivity of 1 to 20 W/K.

In this case, sizes of the lower substrate 110 and the upper substrate 160 may also be different. As an example, a volume, the thickness, or an area of one of the lower substrate 110 and the upper substrate 160 may be greater than that of the other. Accordingly, the heat absorption or radiation performance of the thermoelectric element can be improved. As an example, at least any one of a volume, a thickness, and an area of the substrate, which is disposed in a high-temperature region for the Seebeck effect or applied as a heating region for the Peltier effect or on which the sealing member for protecting a thermoelectric module from an external environment is disposed, may be greater than a corresponding one of the other substrate.

In addition, a heat radiation pattern, for example, an uneven pattern, may be formed on a surface of at least one of the lower substrate 110 and the upper substrate 160. Accordingly, the heat radiation performance of the thermoelectric element can be improved. When the uneven pattern is formed on a surface in contact with the P-type thermoelectric leg 130 or the N-type thermoelectric leg 140, a bonding property between the thermoelectric leg and the substrate can be improved. The thermoelectric element 100 includes the lower substrate 110, the lower electrodes 120, the P-type thermoelectric legs 130, the N-type thermoelectric legs 140, the upper electrodes 150, and the upper substrate 160.

As illustrated in FIGS. 3 and 4, a sealing member 190 may also be further disposed between the lower substrate 110 and the upper substrate 160. The sealing member may be disposed on side surfaces of the lower electrodes 120, the P-type thermoelectric legs 130, the N-type thermoelectric legs 140, and the upper electrodes 150 between the lower substrate 110 and the upper substrate 160. Accordingly, the lower electrodes 120, the P-type thermoelectric legs 130, the N-type thermoelectric legs 140, and the upper electrodes 150 can be sealed from external moisture, heat, contamination, or the like. In this case, the sealing member 190 may include a sealing case 192 disposed a predetermined distance apart from surfaces of outermost sides of the plurality of lower electrodes 120, outermost sides of the plurality of P-type thermoelectric legs 130 and the plurality of N-type thermoelectric legs 140, and outermost surfaces of the plurality of upper electrodes 150, a sealing member 194 disposed between the sealing case 192 and the lower substrate 110, and a sealing member 196 disposed between the sealing case 192 and the upper substrate 160. As described above, the sealing case 192 may be in contact with the lower substrate 110 and the upper substrate 160 through the sealing members 194 and 196. Accordingly, a problem that heat conduction occurs through the sealing case 192 and thus a temperature difference between the lower substrate 110 and the upper substrate 160 decreases when the sealing case 192 is in direct contact with the lower substrate 110 and the upper substrate 160 can be inhibited. In this case, each of the sealing members 194 and 196 may include at least one of an epoxy resin and a silicone resin or tape of which both surfaces are coated with at least one of an epoxy resin and a silicone resin. The sealing members 194 and 194 may serve to airtightly seal a gap between the sealing case 192 and the lower substrate 110 and a gap between the sealing case 192 and the upper substrate 160, can improve a sealing effect of the lower electrodes 120, the P-type thermoelectric legs 130, the N-type thermoelectric legs 140, and the upper electrodes 150, and may be interchangeably used with a finishing material, a finishing layer, a waterproofing member, a waterproofing layer, or the like. In this case, the sealing member 194, which seals the gap between the sealing case 192 and the lower substrate 110, may be disposed on an upper surface of the lower substrate 110, and the sealing member 196, which seals the gap between the sealing case 192 and the upper substrate 160, may be disposed on a side surface of the upper substrate 160. Meanwhile, guide grooves G for withdrawing lead wires 180 and 182 connected to the electrodes may be formed in the sealing case 192. To this end, the sealing case 192 may be an injection molding part formed of plastic or the like and may be interchangeably used with a sealing cover. However, the above description about the sealing member is only exemplary, and the sealing member may be changed in any of various forms. Although not illustrated in the drawings, a thermal insulation material may be further included to surround the sealing member. Alternatively, the sealing member may further include an insulating component.

As described above, although terms such as "lower substrate 110," "lower electrode 120," "upper electrode 150," and "upper substrate 160" have been used, the terms "upper" and "lower" are arbitrarily used only for the sake of case of understanding and convenience of description, and positions thereof may also be reversed so that the lower substrate 110 and the lower electrode 120 are disposed in upper portions, and the upper electrode 150 and the upper substrate 160 are disposed in lower portions.

Meanwhile, as described above, efforts to use metal substrates have been increasing in order to improve heat conduction performance of the thermoelectric element. However, when the thermoelectric element includes the metal substrates, an advantageous effect in terms of heat conduction can be obtained, but there is a problem that a withstand voltage decreases. Particularly, when the thermoelectric element is applied in a high-voltage environment, a withstand voltage performance of 2.5 kV or more is required. In order to improve the withstand voltage performance of the thermoelectric element, a plurality of insulating layers having different compositions may be disposed between the metal substrates and electrodes. However, a shearing stress can occur due to a low bonding force at an interface between the plurality of insulating layers caused by a difference in coefficient of thermal expansion between the plurality of insulating layers when the thermoelectric element is exposed to high-temperatures such as a reflow environment, and thus, bonding at the interface between the plurality of insulating layers can be destroyed, and an air cap can be generated. The air cap of the interface between the plurality of insulating layers may increase a thermal resistance of the substrate, and thus, a temperature difference between two ends of the thermoelectric element can decrease. When the thermoelectric element is applied to the power generation apparatus, the power generation performance of the power generation apparatus can be reduced.

According to the embodiments, the thermoelectric element with both improved heat conduction performance and withstand voltage performance is obtained by improving a bonding force at the interface between the plurality of insulating layers.

Figure 5:
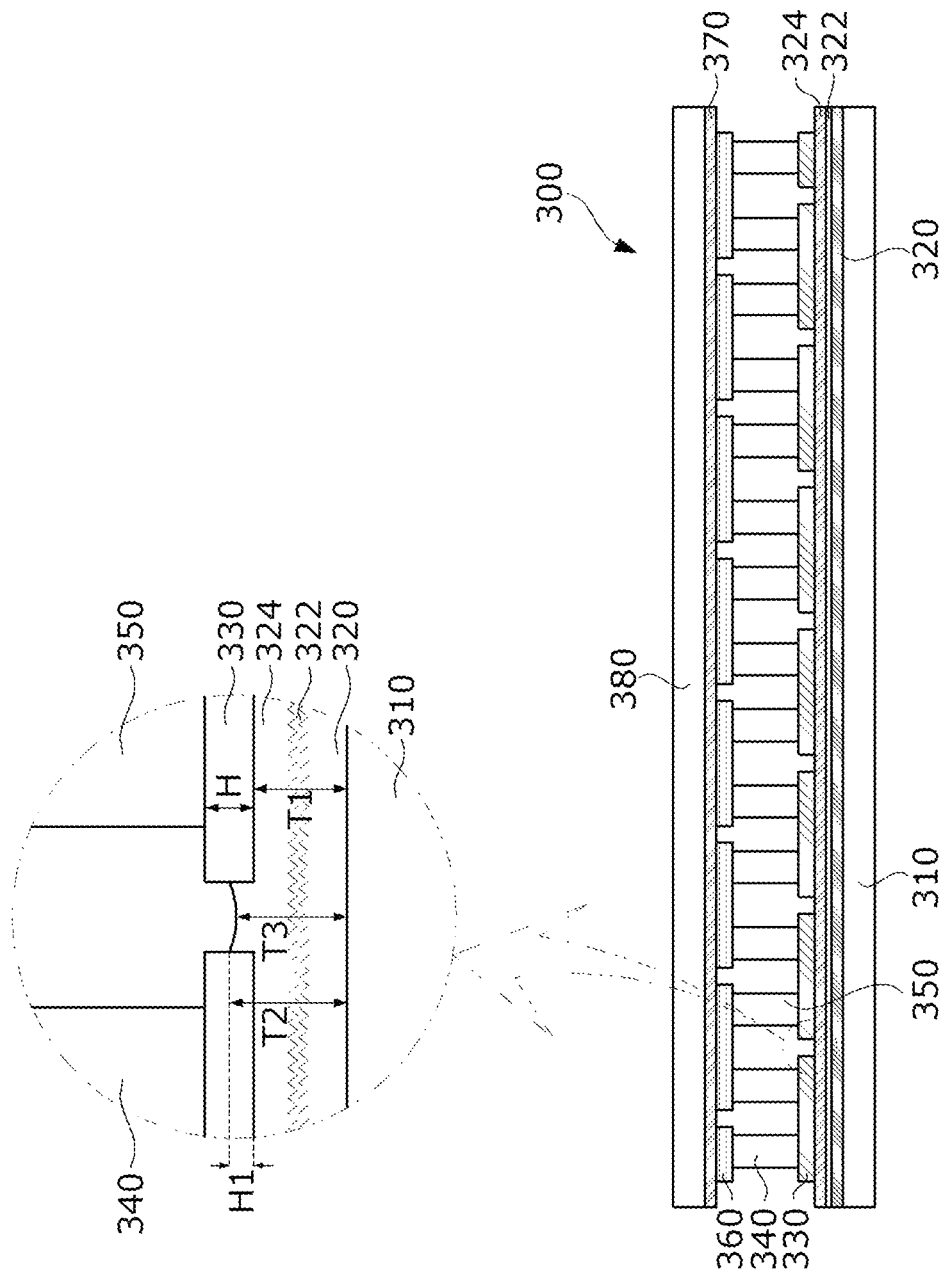
FIG. 5 is a cross-sectional view illustrating a thermoelectric element according to one embodiment of the present invention.
Figure 6:
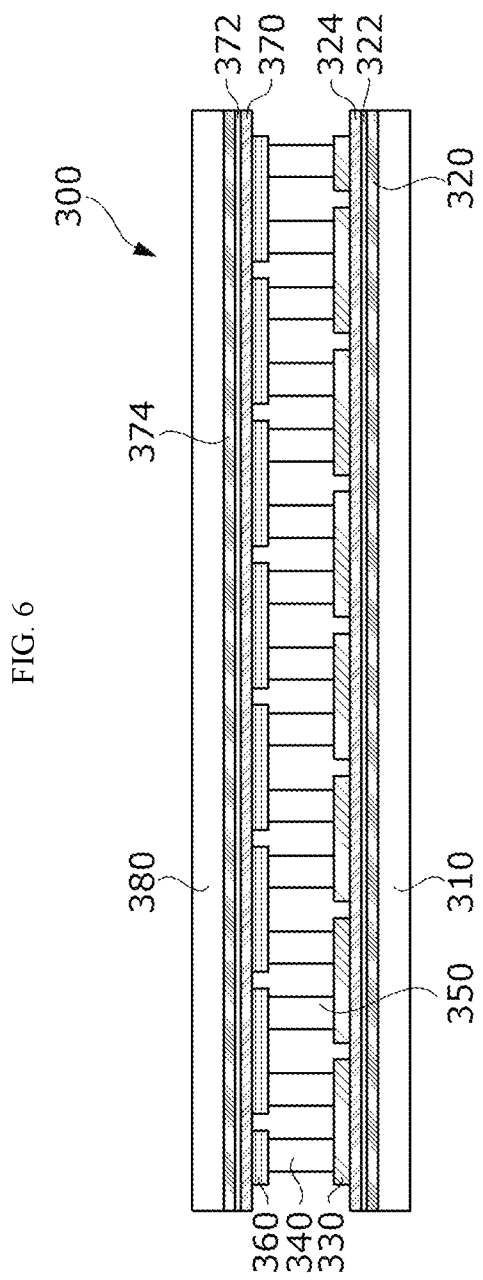
FIG. 6 is a cross-sectional view illustrating a thermoelectric element according to another embodiment of the present invention.
Figure 7:
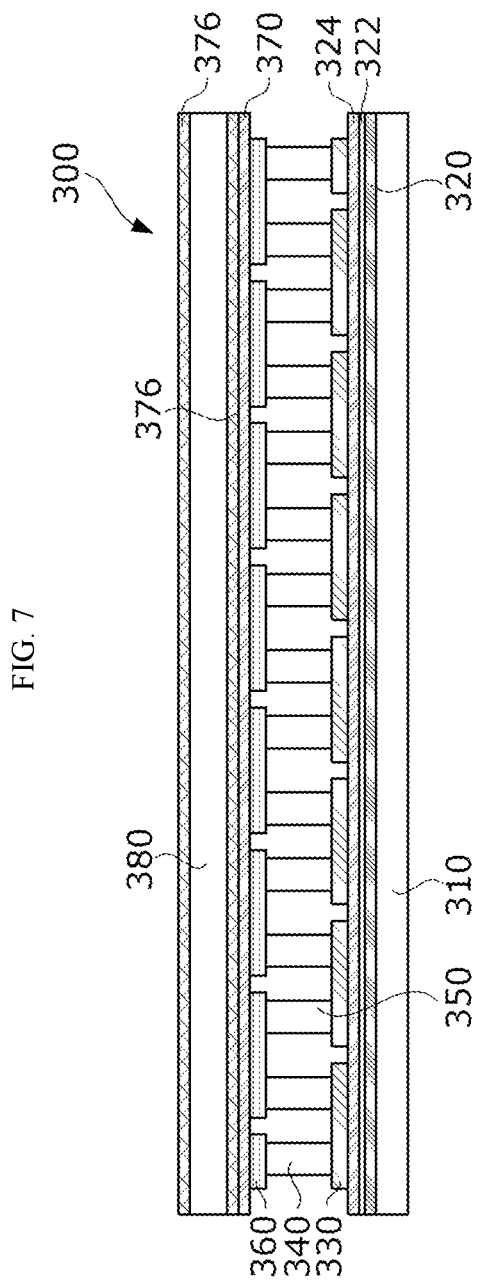
FIG. 7 is a cross-sectional view illustrating a thermoelectric element according to still another embodiment of the present invention.
Figure 8:
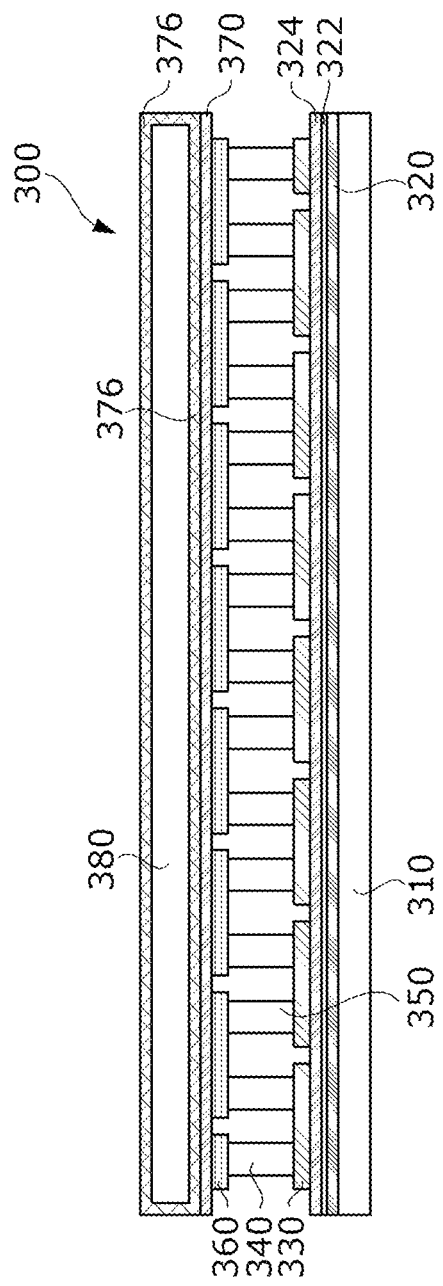
FIG. 8 is a cross-sectional view illustrating a thermoelectric element according to yet another embodiment of the present invention.

FIG. 5 is a cross-sectional view illustrating a thermoelectric element according to one embodiment of the present invention. FIG. 6 is a cross-sectional view illustrating a thermoelectric element according to another embodiment of the present invention. FIG. 7 is a cross-sectional view illustrating a thermoelectric element according to still another embodiment of the present invention. FIG. 8 is a cross-sectional view illustrating a thermoelectric element according to yet another embodiment of the present invention. Descriptions of contents the same as those described with reference to FIGS. 1 to 4 will be omitted.

Referring to FIGS. 5 to 8, a thermoelectric element 300 according to embodiments of the present invention includes a first substrate 310, a first insulating layer 320 disposed on the first substrate 310, a first bonding layer 322 disposed on the first insulating layer 320, a second insulating layer 324 disposed on the first bonding layer 322, a plurality of first electrodes 330 disposed on the second insulating layer 324, a plurality of P-type thermoelectric legs 340 and a plurality of N-type thermoelectric legs 350 disposed on the plurality of first electrodes 330, a plurality of second electrodes 360 disposed on the plurality of P-type thermoelectric legs 340 and the plurality of N-type thermoelectric legs 350, a third insulating layer 370 disposed on the plurality of second electrodes 360, and a second substrate 380 disposed on the third insulating layer 370.

Although not illustrated in FIGS. 5 to 8, a heat sink may be further disposed on the first substrate 310 or the second substrate 380, and a sealing member may be further disposed between the first substrate 310 and the second substrate 380.

Generally, a wire may be connected to a low-temperature part of the thermoelectric element 300. In addition, devices and materials of an application to which the thermoelectric element 300 is applied may be mounted on a high-temperature part of the thermoelectric element 300. Accordingly, withstand voltage performance of both the low-temperature part and the high-temperature part of the thermoelectric element 300 may be required.

Meanwhile, the high-temperature part of the thermoelectric element 300 may require higher heat conduction performance than the low-temperature part thermoelectric element 300. A copper substrate has a higher thermal conductivity and a higher electrical conductivity than an aluminum substrate. Accordingly, among the first substrate 310 and the second substrate 380, the substrate disposed at the low-temperature part of the thermoelectric element 300 may be an aluminum substrate, and the substrate disposed at the high-temperature part of the thermoelectric element 300 may be a copper substrate. Both high withstand voltage performance of the low-temperature part and high heat radiation performance of the high-temperature part can be satisfied.

Meanwhile, according to the embodiments, the first insulating layer 320 and the second insulating layer 324 are disposed on the first substrate 310, and the first electrodes 330 are disposed on the second insulating layer 324.

In this case, the first insulating layer 320 may also include a composite containing silicon and aluminum. In this case, the composite may be an organic-inorganic composite formed of an inorganic material containing Si elements and Al elements and alkyl chains and may be at least one among an oxide, a carbide, and a nitride containing silicon and aluminum. As an example, the composite may include at least one among an Al—Si bond, an Al—O—Si bond, an Si—O bond, an Al—Si—O bond, and an Al—O bond. The composite, which includes at least one among the Al—Si bond, the Al—O—Si bond, the Si—O bond, the Al—Si—O bond, and the Al—O bond as described above, may have high insulation performance, and thus high withstand voltage performance can be achieved. Alternatively, the composite may also be an oxide, a carbide, or a nitride composite further containing titanium, zirconium, boron, zinc, or the like in addition to silicon and aluminum. To this end, the composite may be obtained in a process of mixing and thermally treating at least one of an inorganic binder and a mixed organic-inorganic binder and aluminum. The inorganic binder may include, for example, at least one among, silica ($SiO_2$), a metal alkoxide, boron oxide ($B_2O_3$), and zinc oxide ($ZnO_2$). The inorganic binder is inorganic particles, and when the inorganic binder is in contact with water, the inorganic binder may enter a sol or gel state to serve as a binder. In this case, at least one among silica ($SiO_2$), a metal alkoxide, boron oxide ($B_2O_3$), and zinc oxide ($ZnO_2$) may serve to improve adhesion with aluminum or adhesion with the first substrate 310, and zinc oxide ($ZnO_2$) may serve to improve strength and a thermal conductivity of the first insulating layer 320.

In this case, the composite at 80 wt % or more, preferably at 85 wt % or more, more preferably at 90 wt % or more based on the total wt % of the first insulating layer 320 may be included in the first insulating layer 320.

In this case, the first insulating layer 320 may be formed so that a surface roughness $R_a$ is 0.1 μm or more. Particles constituting the composite may protrude from a surface of the first insulating layer 320 or generate the surface roughness, and the surface roughness may be measured using a surface roughness tester. The surface roughness tester may measure a profile curve using a probe and calculate a surface roughness using a peak line, a valley line, an average line, and a reference length. In the present specification, the surface roughness may be an arithmetic average roughness $R_a$ obtained through a center line average calculation method. The arithmetic average roughness $R_a$ may be obtained through Equation 2 below.

$$R_a = \frac{1}{L}\int_0^L |f(x)|dx \qquad \text{[Equation 2]}$$

That is, an arithmetic average roughness $R_a$ is a value obtained through Equation 2 in units of μm when a profile curve is drawn as much as a reference line L using a probe of a surface roughness tester and expressed as a function f(x) with an x-axis of a direction of an average line and a y-axis of a height direction.

Then, when the surface roughness $R_a$ of the first insulating layer 320 is 0.1 μm or more, a contact area with the second insulating layer 330 may increase, and thus, a bonding strength with the second insulating layer 324 may increase. Particularly, as described below, when the second insulating layer 324 is formed as a resin layer, since the resin layer of the second insulating layer 324 easily permeates grooves formed due to the surface roughness of the first insulating layer 320, a bonding strength between the first insulating layer 320 and the second insulating layer 324 can further increase.

In this case, the first insulating layer 320 may be formed on the first substrate 310 through a wet process. In this case, the wet process may be a spray-coating process, a dip-coating process, a screen-printing process, or the like. Accordingly, a thickness of the first insulating layer 320 can be easily controlled, and any of various composites can be applied to the first insulating layer 320.

According to the embodiments, since the first insulating layer 320 is formed of the composite containing silicon and aluminum through the wet process, the surface roughness may become 0.1 μm or more.

Meanwhile, the second insulating layer 324 may be formed of a resin layer including at least one of an epoxy resin composition including an epoxy resin and an inorganic filler and a silicon resin composition including polydimethylsiloxane (PDMS). Accordingly, the second insulating layer 324 can improve an insulation property, a bonding force, and heat conduction performance between the first insulating layer 320 and the first electrode 330.

In this case, the inorganic filler at 60 to 80 wt % may be included in the resin layer. When the inorganic filler at less than 60 wt % is included in the resin layer, a heat conduction effect can be low, and when the inorganic filler at greater than 80 wt % is included in the resin, it is difficult for the inorganic filler to uniformly disperse in the resin, and the resin layer can be easily broken.

In addition, the epoxy resin may include an epoxy compound and a curing agent. In this case, the curing agent at a 1 to 10 volume ratio may be included in the epoxy resin based on a 1 to 10 volume ratio of the epoxy compound. In this case, the epoxy compound may include at least one among a crystalline epoxy compound, an amorphous epoxy compound, and a silicon epoxy compound. The inorganic filler may include at least one of an aluminum oxide and a nitride. In this case, the nitride may include at least one of a boron nitride and an aluminum nitride.

In this case, a particle size of D50 of a boron nitride aggregation may be in the range of 250 to 350 μm, and a particle size of D50 of the aluminum oxide may be in the range of 10 to 30 μm. When the particle size of D50 of the boron nitride aggregation and the particle size of D50 of the aluminum oxide satisfy such value ranges, the boron nitride aggregation and the aluminum oxide may be uniformly dispersed in the resin layer, and thus, a uniform heat conduction effect and bonding performance of the entire resin layer can be achieved.

When the second insulating layer 324 is a resin composition including PDMS resin and an aluminum oxide, a content (for example, a weight ratio) of silicon in the first insulating layer 320 may be greater than a content of silicon in the second insulating layer 324, and a content of aluminum in the second insulating layer 324 may be greater than a content of aluminum in the first insulating layer 320. Accordingly, the silicon in the first insulating layer 320 may mainly contribute to improvement of withstand voltage performance, and the aluminum oxide in the second insulating layer 324 may mainly contribute to improvement of heat conduction performance. Accordingly, although both the first insulating layer 320 and the second insulating layer 324 have insulation performance and heat conduction performance, the withstand voltage performance of the first insulating layer 320 may be higher than the withstand voltage performance of the second insulating layer 324, and the heat conduction performance of the second insulating layer 324 may be higher than the heat conduction performance of the first insulating layer 320.

Meanwhile, the second insulating layer 324 may be formed in a manner in which the resin composition in an uncured or semi-cured state is applied on the first insulating layer 320, and the plurality of prearranged first electrodes 330 are disposed and pressed on the resin composition. Accordingly, since the resin composition constituting the second insulating layer 324 permeates the grooves due to the surface roughness $R_a$ of the first insulating layer 320, a bonding strength between the first insulating layer 320 and the second insulating layer 324 can increase. In addition, a part of a side surface of each of the plurality of first electrodes 330 may be buried in the second insulating layer 324. In this case, a height H1 of the side surface of each of the plurality of first electrodes 330 buried in the second insulating layer 324 may be in the range of 0.1 to 1.0, preferably 0.2 to 0.9, and more preferably 0.3 to 0.8 times a thickness H of each of the plurality of first electrodes 330. Then, when the part of the side surface of each of the plurality of first electrodes 330 is buried in the second insulating layer 324, a contact area between each of the plurality of first electrodes 330 and the second insulating layer 324 may increase, and thus, the heat conduction performance and the bonding strength between each of the plurality of first electrodes 330 and the second insulating layer 324 can be further improved. When the height H1 of the side surface of each of the plurality of first electrodes 330 buried in the second insulating layer 324 is less than 0.1 times the thickness H of each of the plurality of first electrodes 330, it may be difficult to achieve sufficient heat conduction performance and bonding strength between the plurality of first electrodes 330 and the second insulating layer 324, and when the height H1 of the side surface of each of the plurality of first electrodes 330 buried in the second insulating layer 324 is greater than 0.1 times the thickness H of each of the plurality of first electrodes 330, the second insulating layer 324 may be disposed on the plurality of first electrodes 330, and thus, it can be electrically shorted.

More specifically, a thickness of the second insulating layer 324 between the plurality of first electrodes 330 may decrease from the side surface of the electrode toward a central region between the plurality of first electrodes 330 and have a "V" shape having a smooth vertex. Accordingly, the thickness of the second insulating layer 324 between the plurality of first electrodes 330 may have a deviation, and a height T2 of a region in direct contact with the side surface of each of the plurality of first electrodes 330 is highest, and a height T3 of the central region may be smaller than the height T2 of the region in direct contact with the side surface of each of the plurality of first electrodes 330. That is, the height T3 of the central region of the second insulating layer 324 between the plurality of first electrodes 330 may be lowest in the second insulating layer 324 between the plurality of first electrodes 330. In addition, a height T1 of the second insulating layer 324 under the plurality of first electrodes 330 may be smaller than the height T3 of the central region of the second insulating layer 324 between the plurality of first electrodes 330.

Meanwhile, at least one among a hardness, a modulus of elasticity, an elongation, and a Young's modulus of each of the first insulating layer 320 and the second insulating layer 324 may be changed according to the composition of each of the first insulating layer 320 and the second insulating layer 324, and thus, withstand voltage performance, heat conduction performance, bonding performance, and thermal shock mitigation performance can be controlled.

As an example, a weight ratio of the composite based on a total weight of the first insulating layer 320 may be greater than a weight ratio of the inorganic filler based on a total weight of the second insulating layer 324. As described above, the composite may be a composite containing silicon and aluminum, more specifically, may be a composite including at least one of an oxide, a carbide, and a nitride including silicon and aluminum. As an example, the weight ratio of the composite based on the total weight of the first insulating layer 320 may be greater than 80 wt %, and the weight ratio of the inorganic filler based on the total weight of the second insulating layer 324 may be in the range of 60 to 80 wt %. When a content of the composite included in the first insulating layer 320 is greater than a content of ceramic particles included in the second insulating layer 324 as described above, the hardness of the first insulating layer 320 may be greater than the hardness of the second insulating layer 324. Accordingly, the first insulating layer 320 can have both high withstand voltage performance and high heat conduction performance, the second insulating layer 324 can have greater elasticity than the first insulating layer 320, the second insulating layer 324 can improve bonding performance between the first insulating layer 320 and the first electrode 330, and thus when thermoelectric element 300 is driven, a thermal shock can be reduced. In this case, the elasticity may be expressed in a tensile strength. As an example, a tensile strength of the second insulating layer 324 may be in the range of 2 to 5 MPa, preferably 2.5 to 4.5 MPa, and more preferably 3 to 4 MPa, and a tensile strength of the first insulating layer 320 may be in the range of 10 MPa to 100 MPa, preferably 15 MPa to 90 MPa, and more preferably 20 MPa to 80 MPa.

In this case, the thickness of the first insulating layer 320 may be in the range of 20 to 70 μm, preferably 30 to 60 μm, and more preferably 40 to 50 μm, and the thickness of the second insulating layer 330 may be in the range of 80 to 120 μm, preferably 90 to 110 μm, and more preferably 95 to 105 μm. In this case, the thickness of the second insulating layer 324 may be in the range of 1.2 to 3.5, preferably 1.2 to 3, and more preferably 1.2 to 2.5 times the thickness of the first insulating layer 320.

When the thickness of the first insulating layer 320 and the thickness of the second insulating layer 324 satisfy the value ranges, all of the withstand voltage performance, the heat conduction performance, the bonding performance, and the thermal shock mitigation performance can be achieved. Particularly, when the thickness of the first insulating layer 320 is less than 20 μm, it is difficult to achieve high withstand voltage performance, and the first insulating layer 320 is easily broken due to thermal expansion of the second insulating layer 324, and when the thickness of the first insulating layer 320 is greater than 70 μm, heat conduction performance can be degraded.

Meanwhile, according to the embodiments, the first bonding layer 322 may be disposed between the first insulating layer 320 and the second insulating layer 324, and thus the first insulating layer 320 and the second insulating layer 324 may be bonded by the first bonding layer 322. In this case, the first bonding layer 322 may include a silane coupling agent.

FIGS. 9A-9D are a set of views for describing a process in which a first insulating layer, a first bonding layer, and a second insulating layer are disposed on a first substrate.

Figure 9A:
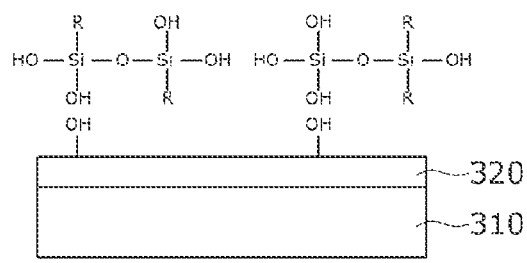
FIGS. 9A-9D are a set of views for describing a process in which a first insulating layer, a first bonding layer, and a second insulating layer are disposed on a first substrate.

Referring to FIG. 9A, after the first insulating layer 320 is disposed on the first substrate 310, the first insulating layer 320 is coated with the silane coupling agent. In this case, the first substrate 310 may be the copper substrate, and the first insulating layer 320 may be coated with a thickness of 20 to 70 μm. In addition, the first insulating layer 320 may be coated with the silane coupling agent with a thickness of 1 to 5 μm. Accordingly, the silane coupling agent may be adhered to a surface of the first insulating layer 320 by hydrogen bonding.

Figure 9B:
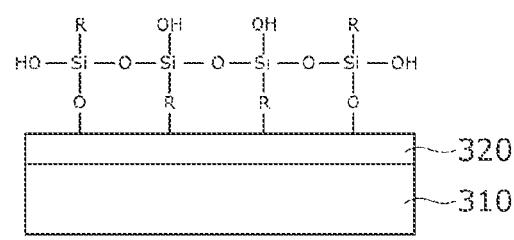

Then, referring to FIG. 9B, the sequentially stacked first substrate 310, first insulating layer 320, and silane coupling agent may be thermally cured. Accordingly, a dehydration condensation reaction may occur between the first insulating layer 320 and the silane coupling agent, and physicochemical bonding may occur between an organic material of the first insulating layer 320 and an organic material of the silane coupling agent at the same time. Accordingly, the first insulating layer 320 and the silane coupling agent may be chemically bonded, and as a result, the surface of the first insulating layer 320 may be reformed by a functional group of the silane coupling agent.

Figure 9C:
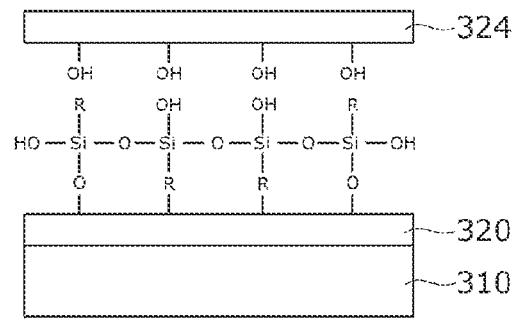
Figure 9D:
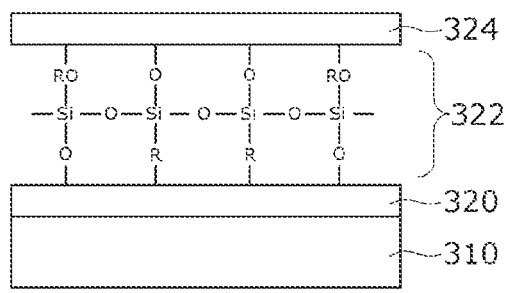

Then, referring to FIG. 9C, the second insulating layer 324 is screen-printed with a thickness of 80 to 120 μm, and referring to FIG. 9D, the electrodes (not shown) may be disposed, pressed, and thermally cured on the second insulating layer 324. Accordingly, a dehydration condensation reaction may occur between the functional group of the silane coupling agent and the second insulating layer 324, and physicochemical bonding may occur between the functional group of the silane coupling agent and an organic material of the second insulating layer 324. Accordingly, the silane coupling agent and the second insulating layer 324 may be chemically bonded.

Accordingly, since the first insulating layer 320 and the second insulating layer 324, which have different compositions and elasticities, may be chemically bonded through the first bonding layer 322, even when the first insulating layer 320 and the second insulating layer 324 between the first substrate 310 and the first electrodes 330 are exposed to high-temperatures, a bonding force at an interface between the first insulating layer 320 and the second insulating layer 324 can be maintained.

In this case, the silane coupling agent included in the first bonding layer 322 according to the embodiments of the present invention may include at least one functional group among an epoxy group, an amino group, and a vinyl group. The silane coupling agent including the epoxy group may be, for example, 3-glycidoxypropyl trimethoxysilane. The silane coupling agent including the amino group may be, for example, 3-aminopropyl trimethoxysilane. The silane coupling agent including the vinyl group may be, for example, vinyltrichlorosilane.

In this case, a thickness of the first bonding layer 322 may be in the range of 1 to 5 μm. When the thickness of the first bonding layer 322 is less than 1 μm, the functional group which contributes to chemical bonding between the first insulating layer 320 and the second insulating layer 324 is insufficient, and thus, a desired magnitude of a bonding force at the interface between the first insulating layer 320 and the second insulating layer 324 can be not secured. In addition, when the thickness of the first bonding layer 322 is greater than 5 μm, a thermal resistance may increase, and thus, a generated power amount can be reduced.

Meanwhile, although not illustrated in the drawings, an area of the second insulating layer 324 may be smaller than an area of the first insulating layer 320. That is, the second insulating layer 324 may be disposed on a part of the first insulating layer 320 instead of the entire first insulating layer 320. As an example, the second insulating layer 324 may be disposed in a region which vertically overlaps the plurality of first electrodes 330, the plurality of P-type and N-type thermoelectric legs 340 and 350, and the plurality of second electrodes 360, and an edge of the second insulating layer 324 may be disposed a predetermined distance apart from an edge of the first insulating layer 320. Accordingly, a warpage phenomenon of the first substrate 310 due to a difference in coefficient of thermal expansion between the first insulating layer 320 and the second insulating layer 324 can be improved, and a thermal stress can be reduced. Accordingly, a problem of separation or electrical disconnection of the first electrodes 330 or the thermoelectric legs 340 and 350 can be inhibited, a heat conduction effect can be improved, and ultimately, a generated power amount or cooling property of the thermoelectric element can be improved.

In this case, the first insulating layer 324 may include an overlapping region which vertically overlaps the plurality of first electrodes 330, the plurality of P-type and N-type thermoelectric legs 340 and 350, and the plurality of second electrodes 360 and a pair of protruding regions protruding from one surface of the protruding region, and the pair of protruding regions may be disposed apart from each other. In this case, terminal electrodes may be disposed on the pair of protruding regions, and connectors for connecting lead wires 181 and 182 may be disposed on the terminal electrodes. In this case, the protruding regions may also be disposed a predetermined distance apart from the edge of the first insulating layer 324. Accordingly, even when the coefficient of thermal expansion of the second insulating layer 324 is greater than the coefficient of thermal expansion of the first insulating layer 320, the warpage problem of the first substrate 310 can be minimized.

Hereinafter, withstand voltage performance, bonding performance, and power generation performance of a structure using a comparative example and examples according to the embodiments of the present invention will be described.

In the comparative example, a copper substrate having a thickness of 0.3 mm was spray-coated with a first insulating layer 320 having a thickness of 45 μm, a second insulating layer 324 having a thickness of 100 μm was screen-printed on the first insulating layer 320, and electrodes were pressed and thermally cured on the second insulating layer 324.

In Example 1, a copper substrate having a thickness of 0.3 mm was spray-coated with a first insulating layer 320 having a thickness of 45 μm, the first insulating layer 320 was coated with vinyltrichlorosilane of a thickness of 2 to 5 μm and thermally cured, a second insulating layer 324 having a thickness of 100 μm was screen-printed on the vinyltrichlorosilane, and electrodes were pressed and thermally cured on the second insulating layer 324.

In Example 2, a copper substrate having a thickness of 0.3 mm was spray-coated with a first insulating layer 320 having a thickness of 5 μm, the first insulating layer 320 was coated with 3-aminopropyl trimethoxysilane of a thickness of 2 to 5 μm and thermally cured, a second insulating layer 324 having a thickness of 100 μm was screen-printed on the 3-aminopropyl trimethoxysilane, and electrodes were pressed and thermally cured on the second insulating layer 324.

In Example 3, a copper substrate having a thickness of 0.3 mm was spray-coated with a first insulating layer 320 having a thickness of 45 μm, the first insulating layer 320 was coated with 3-glycidoxypropyl trimethoxysilane of a thickness in the range of 2 to 5 μm and thermally cured, a second insulating layer 324 having a thickness of 100 μm was screen-printed on the 3-glycidoxypropyl trimethoxysilane, and electrodes were pressed and thermally cured on the second insulating layer 324.

A withstand voltage, a shearing stress between the first insulating layer and the second insulating layer, and a generated power amount were measured for each of the comparative example and the examples 1 to 3. In this case, the withstand voltage performance may be a property of maintaining for one minute without dielectric breakdown under the conditions of a voltage of AC 2.5 kV, a current of 10 mA, and a frequency of 60 Hz. The withstand voltage performance was measured through a method in which an insulating layer was disposed on a substrate, one terminal was connected to the substrate, different terminals were connected to nine points of the insulating layer, and whether the insulating layer is maintained without dielectric breakdown for one minute under the conditions of the voltage of AC 2.5 kV, the current of 10 mA, and the frequency of 60 Hz was tested. In addition, the shearing stress was measured by measuring a force which breaks bonding between three electrodes and a second insulating layer using a push-pull gauge. Table 1 shows a measurement result of the withstand voltage, the shearing stress, and the generated power amount according to the comparative example and Examples 1 to 3.

TABLE 1

| Test No. | Withstand Voltage Evaluation | | | Shearing Stress (N) | Generated Power Amount (W) |
|---|---|---|---|---|---|
| Comparative Example | pass pass pass | pass pass pass | pass Pass Pass | 40, 41, 45 | 19.3 |
| Example 1 | pass pass pass | pass pass pass | pass pass pass | 96, 95, 99 | 25.4 |
| Example 2 | pass pass pass | pass pass pass | pass pass pass | 112, 118, 122 | 27.4 |
| Example 3 | pass | pass | pass | 214, 216, 222 | 32.0 |

Referring to Table 1, it can be seen that, although the withstand voltage performance is satisfied in all the comparative example and Examples 1 to 3, the shearing stress and the generated power amount of each of Examples 1 to 3 are greater than those of the comparative example. That is, when the silane coupling agent is disposed between the first insulating layer 320 and the second insulating layer 324, the first insulating layer 320 and the second insulating layer 324 are bonded by a greater bonding strength, and as a result, the generated power amount is increased compared to a case in which the first insulating layer 320 and the second insulating layer 324 are directly bonded. Particularly, when Examples 1 to 3 are compared, it can be seen that the shearing stress and the generated power amount of Example 3, in which the silane coupling agent including the epoxy group is used, are greatest, and the shearing stress and the generated power amount of Example 2 including the silane coupling agent including the amino group and the shearing stress and the generated power amount of Example 1 including the silane coupling agent including the vinyl group are great in order. This may be because, when the silane coupling agent includes the epoxy group, oxygen of the epoxy group is further hydrogen-bonded to a siloxane in the resin layer of the second insulating layer 324 to maintain a strong bonding force. Meanwhile, referring to FIG. 5, the first insulating layer 320, the first bonding layer 322, and the second insulating layer 324 are sequentially disposed between the first substrate 310 and the first electrodes 330, and the third insulating layer 370 is disposed between the second electrodes 360 and the second substrate 380. In this case, the third insulating layer 370 may be formed of a resin layer including at least one of an epoxy resin composition including an epoxy resin and an inorganic filler and a silicon resin composition including PDMS. Accordingly, the third insulating layer 370 can improve insulation, a bonding force, and heat conduction performance between the second electrodes 360 and the second substrate 380. In this case, at least one among a composition, a thickness, a hardness, a modulus of elasticity, an elongation, and a Young's modulus of the third insulating layer 370 may be the same as or different from at least one among the composition, the thickness, the hardness, the modulus of elasticity, the elongation, and the Young's modulus of the second insulating layer 324. As an example, according to positions of the high-temperature part and the low-temperature part of the thermoelectric element 300, at least one among the composition, the thickness, the hardness, the modulus of elasticity, the elongation, and the Young's modulus of the third insulating layer 370 may be different from at least one among the composition, the thickness, the hardness, the modulus of elasticity, the elongation, and the Young's modulus of the second insulating layer 324.

As an example, the first substrate 310 may be disposed on the high-temperature part of the thermoelectric element 300, and the second substrate 380 may be disposed on the low-temperature part of the thermoelectric element 300. Accordingly, since the first substrate 310 is frequently exposed to high temperatures, delamination easily occurs between the first substrate 310 and the first electrodes 330 due to a difference in coefficient of thermal expansion therebetween. According to the embodiment of the present invention, when the first insulating layer 320, the first bonding layer 322, and the second insulating layer 324 are disposed between the first substrate 310 and the first electrodes 330, even when the thermoelectric element 300 is frequently exposed to the high-temperatures, a high bonding strength can be maintained between the first substrate 310 and the first electrodes 330.

Alternatively, referring to FIG. 6, a structure between the first substrate 310 and the first electrodes 330 may be symmetrical with a structure between the second substrate 380 and the second electrodes 360. That is, the first insulating layer 320, the first bonding layer 322, and the second insulating layer 324 may also be sequentially disposed between the first substrate 310 and the first electrodes 330, and the third insulating layer 370, a second bonding layer 372, and a fourth insulating layer 374 may also be sequentially disposed between the second electrodes 360 and the second substrate 380. In this case, the third insulating layer 370 may be formed of a resin layer including at least one of an epoxy resin composition including an epoxy resin and an inorganic filler and a silicon resin composition including PDMS, the fourth insulating layer 374 may also include a composite including silicon and aluminum like the first insulating layer 320, and the second bonding layer 372 may include a silane coupling agent.

Alternatively, referring to FIGS. 7 and 8, the first insulating layer 320, the first bonding layer 322, and the second insulating layer 324 may be sequentially disposed between the first substrate 310 and the first electrodes 330, and the third insulating layer 370 may be disposed between the second electrodes 360 and the second substrate 380. In this case, the third insulating layer 370 may be formed of a resin layer including at least one of an epoxy resin composition including an epoxy resin and an inorganic filler and a silicon resin composition including PDMS.

In addition, the second substrate 380 may be the aluminum substrate, and an aluminum oxide layer 376 may be further disposed between the third insulating layer 370 and the second substrate 380. In this case, the aluminum oxide layer 376 may be an aluminum oxide layer additionally stacked on the second substrate 380 or an aluminum oxide layer which is oxidized by treating a surface of the second substrate 380 which is the aluminum substrate. As an example, the aluminum oxide layer may be formed by anodizing the second substrate 380 which is the aluminum substrate or formed through a dipping process or spray process.

In this case, as illustrated in FIG. 7, among two surfaces of the second substrate 380, the aluminum oxide layer 376 may be disposed on a surface opposite to a surface on which the third insulating layer 370 is disposed in addition to the surface on which the third insulating layer 370 is disposed.

Alternatively, as illustrated in FIG. 8, an aluminum oxide layer 376 may also be disposed on an entire surface of the second substrate 380.

Accordingly, the aluminum oxide layer 376 can improve withstand voltage performance while not increasing a thermal resistance of the second substrate 380 and inhibit corrosion of the surface of the second substrate 380. When the first substrate 310 is disposed on the high-temperature part of the thermoelectric element 300, and the second substrate 380 is disposed in the low-temperature part of the thermoelectric element 300, the first substrate 310 may be the copper substrate, and the second substrate 380 may be the aluminum substrate in order to optimize heat conduction performance and withstand voltage performance. In this case, when the aluminum oxide layer is further disposed on the aluminum substrate as in the embodiments of FIGS. 7 and 8, a withstand voltage of the aluminum substrate can be increased. Particularly, since the aluminum oxide layer may be easily formed by anodizing the aluminum substrate, a manufacturing process can be simplified.

Meanwhile, as described above, according to the embodiments, a heat sink may be bonded to at least one of the first substrate 310 and the second substrate 380.

FIGS. 10A and 10B are a set of views illustrating a coupling structure of a thermoelectric element according to one embodiment of the present invention.

Referring to FIGS. 10A and 10B, a thermoelectric element 300 may be assembled by a plurality of coupling members 400. As an example, when a heat sink 390 is disposed on a first substrate 310, the plurality of coupling members 400 may couple the heat sink 390 and the first substrate 310, couple the heat sink 390, the first substrate 310, and a second substrate (not shown), couple the heat sink 390, the first substrate 310, the second substrate (not shown), and a cooling part (not shown), couple the first substrate 310, the second substrate (not shown), and the cooling part (not shown), or couple the first substrate 310 and the second substrate (not shown). Alternatively, the second substrate (not shown) and the cooling part (not shown) may be connected by another coupling member at an outer side of an effective region on the second substrate (not shown).

To this end, through holes S through which the coupling members 400 pass may be formed in the heat sink 390, the first substrate 310, the second substrate (not shown), and the cooling part (not shown). In this case, additional insulation insertion members 410 may be further disposed between the through holes S and the coupling members 400. The additional insulation insertion members 410 may be insulation insertion members surrounding outer circumferential surfaces of the coupling members 400 or insulation insertion members surrounding wall surfaces of the through holes S. Accordingly, an insulation distance of the thermoelectric element can be increased.

Meanwhile, a shape of the insulation insertion member 410 may be similar to one of shapes illustrated in FIGS. 10A and 10B. As an example, as illustrated in FIG. 10A, the insulation insertion member 410 may be disposed so that a step is formed in a region of the through hole S formed in the first substrate 310 to surround a part of the wall surface of the through hole S. Alternatively, the insulation insertion member 410 may be disposed so that a step is formed in a region of the through hole S formed in the first substrate 310 to extend to a first surface on which a second electrode (not shown) is disposed along the wall surface of the through hole S.

Referring to FIG. 10A, a diameter d2' of the through hole S of the first surface in contact with a first electrode of the first substrate 310 may be the same as a diameter of the through hole of the first surface in contact with the second electrode of the second substrate. In this case, according to the shape of the insulation insertion member 410, the diameter d2' of the through hole S formed in the first surface of the first substrate 310 may be different from the diameter d2 of the through hole S formed in a second surface which is a surface opposite to the first surface. Although not illustrated in the drawings, when a step is not formed in the region of the through hole S, and the insulation insertion member 410 is disposed on only a part of an upper surface of the first substrate 310, or the insulation insertion member 410 is disposed to extend from the upper surface of the first metal substrate 310 to a part or entirety of the wall surface of the through hole S, the diameter d2' of the through hole S formed in the first surface of the first substrate 310 may be the same as the diameter d2 of the through hole S formed in the second surface which is the surface opposite to the first surface.

Referring to FIG. 10B, according to the shape of the insulation insertion member 410, a diameter d2' of the through hole S of the first surface in contact with a first electrode of the first substrate 310 may be greater than a diameter of the through hole of the first surface in contact with the second electrode of the second substrate. In this case, the diameter d2' of the through hole S of the first surface of the first substrate 310 may be 1.1 to 2.0 times the diameter of the through hole of the first surface of the second substrate. When the diameter d2' of the through hole S of the first surface of the first substrate 310 is less than 1.1 times the diameter of the through hole of the first surface of the second substrate, an insulation effect of the insulation insertion member 410 may be small, and thus, dielectric breakdown of the thermoelectric element can occur. When the diameter d2' of the through hole S of the first surface of the first substrate 310 is greater than 2.0 times the diameter of the through hole of the first surface of the second substrate, a size of a region occupied by the through hole S may relatively increase, an effective area of the first substrate 310 may decrease, and thus, an efficiency of the thermoelectric element can decrease.

In addition, due to the shape of the insulation insertion member 410, the diameter d2' of the through hole S formed in the first surface of the first substrate 310 may be different from the diameter d2 of the through hole S formed in a second surface which is a surface opposite to the first surface. As described above, when a step is not formed in a region of the through hole S of the first substrate 310, the diameter d2' of the through hole S formed in the first surface of the first substrate 310 may be the same as the diameter d2 of the through hole S formed in the second surface which is the surface opposite to the first surface.

Although not illustrated in the drawings, the thermoelectric element according to the embodiment of the present invention is applied to a power generation apparatus using the Seebeck effect, the thermoelectric element may be coupled to a first fluid flow part and a second fluid flow part. The first fluid flow part may be disposed on one of the first substrate and the second substrate of the thermoelectric element, and the second fluid flow part may be disposed on the other of the first substrate and the second substrate of the thermoelectric element. A flow path may be formed in at least one of the first fluid flow part and the second fluid flow part so that at least one of a first fluid and a second fluid flows through the flow path. As necessary, at least one of the first fluid flow part and the second fluid flow part may be omitted, and at least one of the first fluid and the second fluid may also directly flow to the substrate of the thermoelectric element. As an example, the first fluid may flow while being adjacent to one of the first substrate and the second substrate, and the second fluid may flow while being adjacent to the other. In this case, a temperature of the second fluid may be higher than a temperature of the first fluid. Accordingly, the first fluid flow part may be referred to as a cooling part. As another example, the temperature of the first fluid may be higher than the temperature of the second fluid. Accordingly, the second fluid flow part may be referred to as a cooling part. The heat sink 390 may be connected to a substrate of one fluid flow part, through which a fluid having a higher temperature flows, among the first fluid flow part and the second fluid flow part. An absolute value of a temperature difference between the first fluid and the second fluid may be 40° C. or more, preferably 70° C. or more, and more preferably in the range of 95° C. to 185° C.

While the present invention has been described with reference to exemplary embodiments thereof, it will be understood by those skilled in the art that the present invention may be various changed and modified without departing from the spirit and scope of the invention defined by the appended claims below.

The invention claimed is:

1. A thermoelectric element comprising:
   a first substrate;
   a first insulating layer disposed on the first substrate;
   a first bonding layer disposed on the first insulating layer;
   a second insulating layer disposed on the first bonding layer;
   first electrodes disposed on the second insulating layer;
   a P-type thermoelectric leg and an N-type thermoelectric leg disposed on the first electrodes;
   second electrodes disposed on the P-type thermoelectric leg and the N-type thermoelectric leg;
   a third insulating layer disposed on the second electrodes; and
   a second substrate disposed on the third insulating layer, wherein the first insulating layer is formed of a composite containing silicon and aluminum, the second insulating layer is formed of a resin layer including a resin composition including at least one of an epoxy resin and a silicon resin and an inorganic filler, and the first bonding layer includes a silane coupling agent.

2. The thermoelectric element of claim 1, wherein the silane coupling agent includes at least one functional group among an epoxy group, an amino group, and a vinyl group.

3. The thermoelectric element of claim 1, wherein:
the first insulating layer and the first bonding layer are chemically bonded to each other; and
the first bonding layer and the second insulating layer are chemically bonded to each other.

4. The thermoelectric element of claim 1, wherein a thickness of the first bonding layer is in a range of 1 to 5 µm.

5. The thermoelectric element of claim 4, wherein:
a thickness of the second insulating layer is greater than a thickness of the first insulating layer; and
the thickness of the first insulating layer is greater than a thickness of the first bonding layer.

6. The thermoelectric element of claim 1, wherein the third insulating layer is formed of a resin layer including a resin composition including at least one of an epoxy resin and a silicon resin and an inorganic filler.

7. The thermoelectric element of claim 6, comprising:
a fourth insulating layer disposed between the third insulating layer and the second substrate and formed of a composite containing silicon and aluminum; and
a second bonding layer disposed between the third insulating layer and the fourth insulating layer and including a silane coupling agent.

8. The thermoelectric element of claim 6, comprising an aluminum oxide layer disposed between the third insulating layer and the second substrate,
wherein the second substrate includes an aluminum substrate.

9. The thermoelectric element of claim 1, comprising a heat sink disposed on at least one of the first substrate and the second substrate.

10. A power generation apparatus comprising:
a first fluid flow part in which a flow path is configured to allow a first fluid to flow;
a thermoelectric element coupled to the first fluid flow part; and
a second fluid flow part that is coupled to the thermoelectric element and in which a flow path is configured to allow a second fluid having a higher temperature than the first fluid to flow,
wherein the thermoelectric element includes a first substrate coupled to the first fluid flow part,
a first insulating layer disposed on the first substrate,
a first bonding layer disposed on the first insulating layer,
a second insulating layer disposed on the first bonding layer,
first electrodes disposed on the second insulating layer,
a P-type thermoelectric leg and an N-type thermoelectric leg disposed on the first electrodes,
second electrodes disposed on the P-type thermoelectric leg and the N-type thermoelectric leg,
a third insulating layer disposed on the second electrodes, and
a second substrate disposed on the third insulating layer and coupled to the second fluid flow part, wherein
the first insulating layer is formed of a composite containing silicon and aluminum,
the second insulating layer is formed of a resin layer including a resin composition including at least one of an epoxy resin and a silicon resin and an inorganic filler, and
the first bonding layer includes a silane coupling agent.

11. The thermoelectric element of claim 1, wherein one of the first substrate and the second substrate is a copper substrate, and the other is an aluminum substrate.

12. The thermoelectric element of claim 1, wherein a surface roughness Ra of the first insulating layer is 0.1 µm or more.

13. The thermoelectric element of claim 1, wherein a content of silicon in the first insulating layer is greater than a content of silicon in the second insulating layer, and a content of aluminum in the second insulating layer is greater than a content of aluminum in the first insulating layer.

14. The thermoelectric element of claim 1, wherein a part of a side surface of the first electrode is buried in the second insulating layer.

15. The thermoelectric element of claim 1, wherein a thickness of the second insulating layer is in a range of 1.2 to 3.5 times a thickness of the first insulating layer.

16. The thermoelectric element of claim 1, wherein an area of the second insulating layer is smaller than an area of the first insulating layer.

17. The thermoelectric element of claim 8, wherein the aluminum oxide layer is disposed on an entire surface of the second substrate.

18. The thermoelectric element of claim 9, wherein the at least one of the first substrate and the second substrate is coupled to the heatsink by a coupling member.

19. The thermoelectric element of claim 18, wherein through holes through which the coupling member passes are formed on the at least one of the first substrate and the second substrate and the heatsink.

20. The power generation apparatus of claim 10, wherein one of the first substrate and the second substrate is a copper substrate, and the other is an aluminum substrate.

* * * * *